United States Patent [19]

Kobayashi et al.

[11] Patent Number: 4,811,261

[45] Date of Patent: Mar. 7, 1989

[54] ADAPTIVE DIGITAL FILTER FOR DETERMINING A TRANSFER EQUATION OF AN UNKNOWN SYSTEM

[75] Inventors: Masaki Kobayashi; Yoshio Itoh, both of Tokyo, Japan

[73] Assignee: Oki Electric Industry Co., Ltd., Tokyo, Japan

[21] Appl. No.: 833,718

[22] Filed: Feb. 27, 1986

[30] Foreign Application Priority Data

Mar. 4, 1985 [JP] Japan .................................. 60-41053
Dec. 23, 1985 [JP] Japan ................................ 60-290186

[51] Int. Cl.$^4$ ............................................ G06F 15/31
[52] U.S. Cl. ................................ 364/724.19; 364/553
[58] Field of Search ............... 364/724, 151, 158, 159, 364/553

[56] References Cited

U.S. PATENT DOCUMENTS

| | | | |
|---|---|---|---|
| 3,967,102 | 6/1976 | McCown | 364/724 |
| 3,973,112 | 8/1976 | Sloane | 364/553 |
| 4,067,060 | 1/1978 | Poussart et al. | 364/553 |
| 4,377,793 | 3/1983 | Horna | 333/166 |
| 4,520,491 | 5/1985 | Raulin et al. | 364/724 |
| 4,606,045 | 8/1986 | Miller | 364/724 |
| 4,660,163 | 4/1987 | Fukasawa et al. | 364/724 |
| 4,696,015 | 9/1987 | Palicot et al. | 364/724 |

OTHER PUBLICATIONS

Smith, "Identifier for an Unknown Process", *Proc. of IFAC Toyko Symposium*, pp. 255–264, 1965.
Itoh, Yasuo et al., "An Acoustic Echo Canceller for Teleconference", IEEE International Conference on Communication, 1985, pp. 1498–1502.
Cadzow, James A., "Recursive Digital Filter Synthesis Via Gradient Based Algorithms", IEEE Transaction on Acoustics, Speech and Signal Proceeding, vol. AS-SP-24, No. 5, Oct. 1976, pp. 349–355.
Widrow, Bernard et al., "A Comparison of Adaptive Algorithms Based on the Methods of Steepest Descent and Random Search", IEEE Transactions on Antennas and Propagation, vol. AP-24, No. 5, Sep. 1976, pp. 615–637.
Chen, Chi-Tsong, "9-5 Transfer Function of Degree 1 and 2", One-Dimensional Digital Signal Processing, 1979, Marcel Dekker Inc., pp. 310–325.
Lee, Y. W., "4. Laguerre Networks", Tokyo University International Edition No. 58, Statistical Theory of Communication, 1970, John Wiley & Sons Inc., pp. 487–489.

*Primary Examiner*—Gary V. Harkcom
*Assistant Examiner*—Dale M. Shaw
*Attorney, Agent, or Firm*—Wenderoth, Lind & Ponack

[57] ABSTRACT

An adaptive digital filter for identifying a transfer function of a unknown system is employed, for example, for echo cancellation and howling prevention. The transfer function of the adaptive filter can be obtained by the sum of outputs from N paths and forms a system of orthogonal functions having coefficient parameters of four groups of a, b, p and q. The groups p and q are adaptively adjusted in response to an error signal while the groups a and b are previously set based on a measurement effected previously or adaptively adjusted in response to the error signal.

5 Claims, 4 Drawing Sheets

ADAPTIVE DIGITAL FILTER FOR DETERMINING A TRANSFER EQUATION OF AN UNKNOWN SYSTEM

BACKGROUND OF THE INVENTION

1. Field of the Invention

The present invention relates to an adaptive digital filter capable of iteratively updating coefficient parameters of the adaptive digital filter in response to an error signal corresponding to a difference between output signals available from an unknown system and the adaptive digital filter thereby identifying a transfer function of the adaptive filter with that of the unknown system.

2. Description of the Prior Art

Such an adaptive filter is employed as a howling preventing device in a teleconferencing system and an echo canceller in a telephone system, and disclosed, for example, in "An Acoustic Echo Canceller for Teleconference" by Yasuo Itoh et al, IEEE International Conference on Communication pp 1498–1502, 1985.

An adaptive digital filter typically is of a recursive type. A prior adaptive filter of this type is known which has a transfer function H(Z) expressed by an equation (1) and adaptively adjusts coefficient parameters $a_{0i}$, $a_{1i}$, $a_{2i}$ in response to an error signal and thereby estimates a transfer function $H_0(Z)$ of a unknown system.

$$H(Z) = \prod_{i=1}^{N} \frac{a_{0i} + a_{1i}Z^{-1} + a_{2i}Z^{-2}}{1 - b_{1i}Z^{-1} - b_{2i}Z^{-2}} \tag{1}$$

where Z is an operator in the Z-transformation. The coefficient parameters $b_{1i}$, $b_{2i}$ in the denominator of the equation (1) are previously set to an average value of the unknown system usually evaluated by another measurement, and are rarely adaptively adjusted using a stability determination circuit.

SUMMARY OF THE INVENTION

It is an object of the present invention to improve estimation accuracy and a processing rate of coefficient parameters of a transfer function of an unknown system until they reach their optimum values.

To achieve the above object, an adaptive digital filter according to the present invention includes a network means having paths wherein a transfer function $\phi_1(Z)$ of a first path is expressed by a second equation, and a transfer function of an ith (i=2, 3, ..., N) path is expressed by a third equation, both described below, and assumes the output sum of the N paths to be a transfer function $$H(Z) = \sum_{i=1}^{N} \phi_i(Z)$$

of the adaptive filter to identify a transfer function $H_0(Z)$ of an unknown system.

$$\phi_1(Z) = \frac{p_1 + q_1Z^{-1}}{1 - a_1Z^{-1} + b_1Z^{-2}} \tag{2}$$

$$\phi_i(Z) = (p_i + q_iZ^{-1}) \frac{\prod_{l=1}^{i=1} (b_l - a_lZ^{-1} + Z^{-2})}{\prod_{l=1}^{i} (1 - a_lZ^{-1} + b_lZ^{-2})} \tag{3}$$

The identification of the unknown system is effected by adjusting the coefficient parameters including a p group ($p_1$ to $p_n$) and a q group ($q_1$ to $q_n$).

An adjusting algorithm can rely on a conventional method, for example, a steepest decent method.

A set of functions $\phi(Z)$ (i=1, 2, ..., n) expressed by the equations (2) and (3) form an orthogonal function system so far as the coefficient parameters $a_i$, $b_i$ are set so as not to have any pole outside a unit circle in the Z plane. This can be confirmed by use of orthogonal conditions in the Z-domain shown by the following equation (4) or those orthogonal conditions in the time domain shown by the following equation (5).

$$\frac{1}{2\pi j} \oint_\Gamma \phi_i(Z^{-1}) \phi_j(Z) Z^{-1} dZ = 0 \; (i \neq j) \tag{4}$$

where $\Gamma$ is a unit circle in the Z plane, and m, n = 1, 2, ..., k.

$$\sum_{k=0}^{\infty} \psi_i(k)\psi_j(k) = 0 \; (i \neq j) \tag{5}$$

where $\psi_i(k)$ and $\psi_j(k)$ respectively represent the inverse Z-transformations of $\phi_i(z)$ and $\phi_j(z)$.

According to the present invention, an adaptive digital filter is capable of identifying an arbitrary unknown system with a high accuracy by allowing the N paths transfer functions $\phi_i(Z)$ to form a system of orthogonal functions and selecting the number N of the paths for proper large values thereby adaptively adjusting the p group ($p_1$ to $p_n$) and q group ($q_1$ to $q_n$) of the coefficient parameters.

In addition, by employing an adjusting algorithm such as the steepest decent method, differential coefficients, which is related to coefficient parameters for use in that case, can be prepared by using a set of signals forming a system of orthogonal functions, and thus a rate of estimation accuracy and a processing rate for reaching the optimum value of the coefficient parameters can be improved.

DESCRIPTION OF THE PREFERRED EMBODIMENT

Figure 1A:
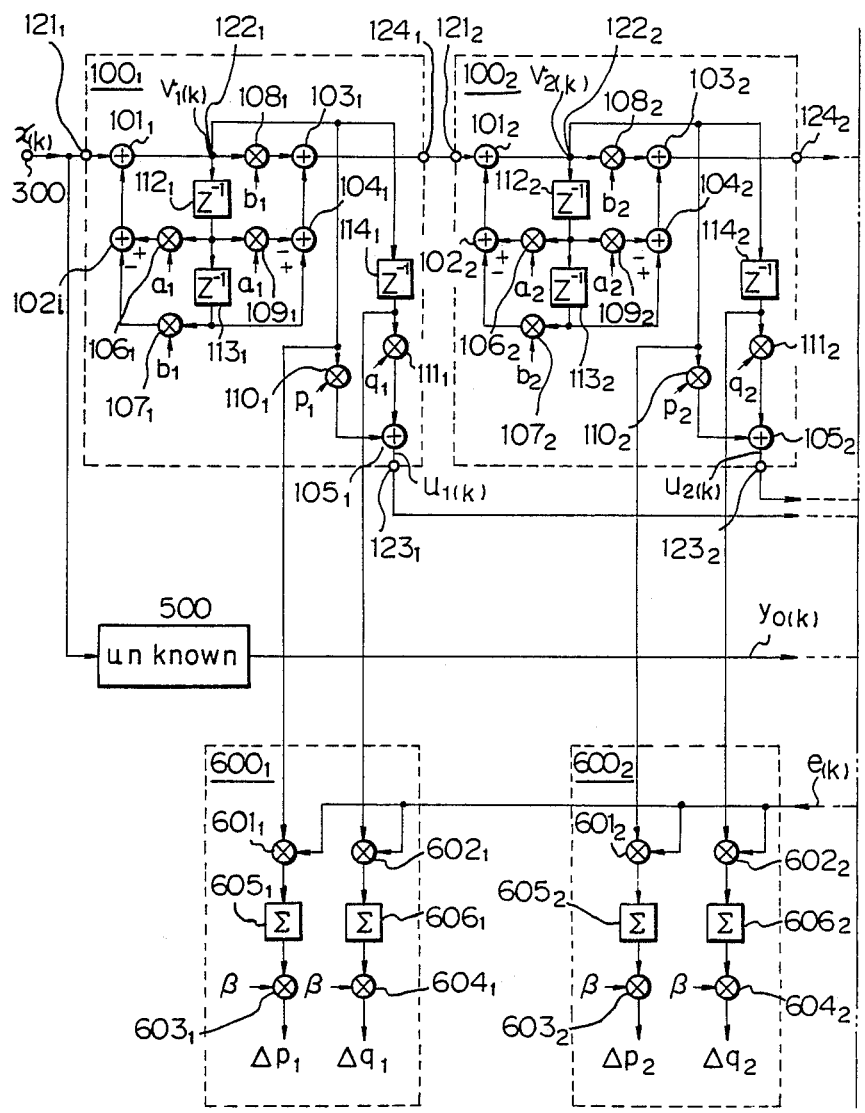
FIG. 1, consisting of FIGS. 1A and 1B, is a block diagram showing an adaptive digital filter according to the present invention.
Figure 1B:
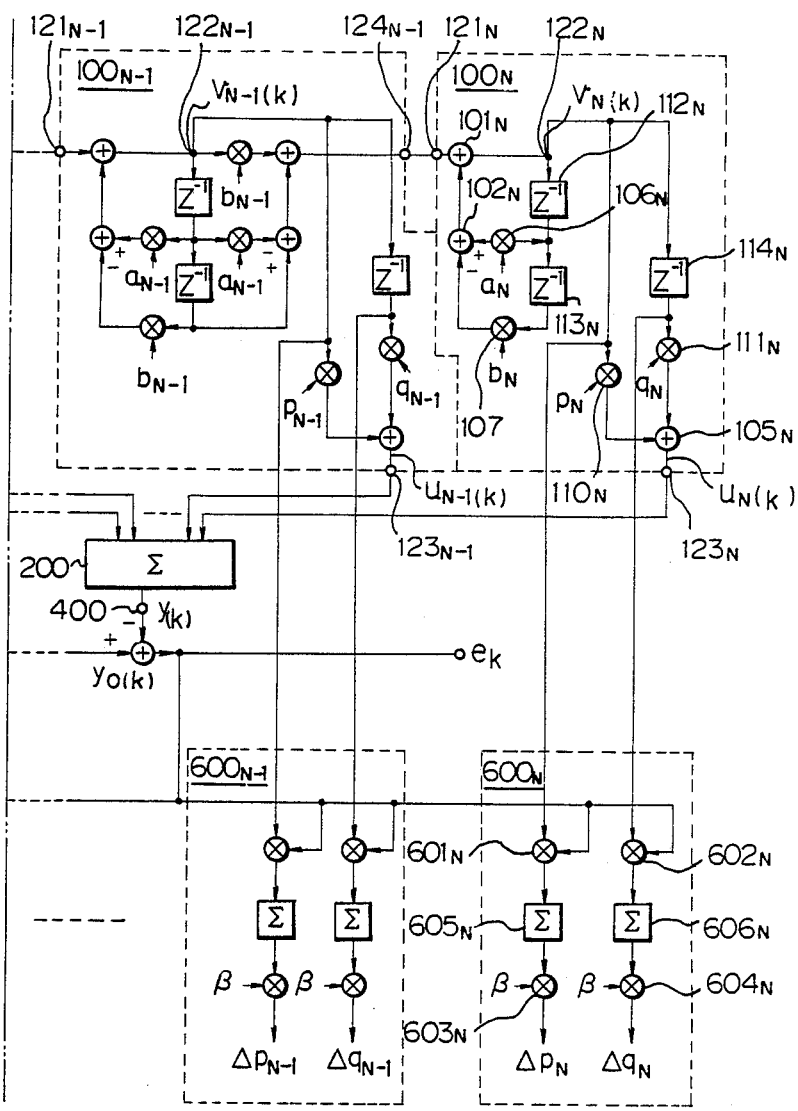

Referring to FIGS. 1A and 1B illustrating an adaptive digital filter according to the present invention together with a unknown system, the filter includes N unit circuits $100_1$ to $100_n$ and an adder 200 wherein an input signal x(k) is provided from an input terminal 300 to the first stage unit circuit $100_1$ and an output signal y(k) is delivered from the adder 200 to an output terminal 400.

The respective unit circuits $100_1, 100_2, \ldots, 100_{n-1}$ from the first to (n−1) stages have substantially the same configuration. Each unit circuit $100_i$ (i=1, 2, ..., n−1) comprises adder elements $101_i$ to $105_i$, multiplier elements $106_i$ to $111_i$ having coefficient parameters $a_i$, $b_i$, $p_i$, $q_i$, and unit delay elements $112_i$ to $114_i$.

Each $100_i$ of these unit circuits forms a secondary recursive filter between an input tap $121_i$ and an intermediate tap $122_i$ having transfer function shown by the following equation (6), forms a primary nonrecursive filter shown by the following equation (7) between an intermediate tap $122_i$ and an output tap $124_i$, and forms a secondary nonrecursive filter shown by the following equation (8) between an intermediate tap $122_i$ and an output tap $124_i$.

$$\frac{1}{1 - a_i Z^{-1} + b_i Z - 2} \tag{6}$$

$$p_i + q_i z^{-1} \tag{7}$$

$$b_i - a_i z^{-1} + z^{-2} \tag{8}$$

The final stage unit circuit $100_n$ has coefficient parameters $a_n$, $b_n$, $p_n$, $q_n$, and forms a secondary recursive filter similar to the equation (6) between the input tap $121_n$ and an intermediate tap $122_n$ and forms a primary nonrecursive filter similar to the equation (7) between the intermediate tap $122_n$ and the first output tap $123_n$.

The input tap $121_1$ of the unit circuit $100_1$ is connected to the input terminal 300, while the input taps $121_2$, $121_3$, are connected to the preceding stage output taps $124_1$, $124_2$, ..., $124_{n-1}$. Thus, a transfer function formed between the input terminal 300 and the intermediate tap $122_1$ can be expressed by the following equation (9) while transfer functions between the input terminal 300 and the intermediate taps $122_2$, $122_3$ ..., $122_n$ can be expressed by the following equation (10). In addition, a path having the transfer function $\phi_1(Z)$ shown by the equation (2) is formed between the input terminal 300 and the output tap $123_1$, and further paths having the transfer functions $\phi_i(Z)$ shown by the equation (3) are formed between the input terminal and the respective output terminals $123_2$, $123_3$, ..., $123_n$.

$$\frac{1}{1 - a_i Z^{-1} + b_i Z^{-2}} \tag{9}$$

$$\frac{\prod_{l=1}^{i-1} (b_l - a_l Z^{-1} + Z^{-2})}{\prod_{l=1}^{i} (1 - a_l Z^{-1} + b_l Z^{-2})} \tag{10}$$

Signals present at these first output taps $123_n$ to $123_k$ are added by the adder 200. Thus the transfer function of the present filter can be expressed by the following equation (11).

$$H(Z) = \sum_{i=1}^{n} \frac{(p_i + q_i Z^{-1}) \prod_{l=1}^{i-1} (b_l - a_l Z^{-1} + Z^{-2})}{\prod_{l=1}^{i} (1 - a_l Z^{-1} + b_l Z^{-2})} \tag{11}$$

Although the present filter does not adjust the coefficient parameters $a_i$, $b_i$ for determining pole positions of the transfer function H(Z), the pole positions of the present filter is previously set by the following equation (12) such that value of the pole positions of the present filter is consistent with the average value of the measured pole positions of a unknown system 500.

$$a_i = 2\gamma_i \cos \theta_i, \quad b_i = \gamma^2_i (i=1, 2, \ldots, n) \tag{12}$$

where $\gamma_i$ is an amplitude of the averaged pole position of the unknown system and $\theta_i$ is a phase thereof.

As shown in FIGS. 1A and 1B, the present filter includes modification amount detector circuits $600_1$ to $600_n$, and using a mean square value of error signals e(k) shown by th following equation (13) as a cost function J for estimating the degree of the approximation, the present filter adaptively adjusts the coefficient parameters of the p and q of groups in conformity with the ordinary steepest decent method shown by the following equations (14) and (15).

$$J = e(k)^2 = \{y(k) - y_o(k)\}^2 \tag{13}$$

$$p_i^{(\nu+1)} = p_i^{(\nu)} - \beta \frac{\partial J}{\partial p_i^{(\nu)}} (i = 1, 2, \ldots, n) \tag{14}$$

$$q_i^{(\nu+1)} = q_i^{(\nu)} - \frac{\partial J}{\partial q_i^{(\nu)}} (i = 1, 2, \ldots, n) \tag{15}$$

where $p_i^{(\nu)}$, $q_i^{(\nu)}$ respectively show values of those parameters after $\nu$-times adjustments, and $\beta$ is a parameter for determining the amount of the adjustment of one time.

The respective modification amount detector circuits $600_i$ (i=1, 2, ..., n) comprise multiplier elements $601_i$ to $604_i$ and accumulators $605_i$, $606_i$, each of which prepares the product of outputs from the multiplier elements $110_i$, $111_i$ with respect to the coefficient parameters and the error signal e(k) using the multiplier elements $601_i$, $602_i$, accumulates the respective outputs in the accumulators $605_i$, $606_i$, takes the product of the resultant output and the constant $\beta$ through the multiplier elements $603_i$, $604_i$, and detects modification values $\Delta p_i$, $\Delta q_i$ each corresponding to the second term on the right side of the previous equations (14) and (15).

Such adaptive adjustment based on the steepest decent method is described in detail in "Recursive Digital Filter Synthesis Via Gradient Based Algorithms" by James A. Cadzow, IEEE Transaction ASSP-24, NO. 5, PP349 to 355, September 1976, and in "A Comparison of Adaptive Alegorithms Based on Methods of Steepest Descent and Random Search" by Bernard Widrow et al, IEEE Transaction AP-24 No. 5, PP615 to 637, September 1976. In addition, the adaptive adjustment for the coefficient parameters may be executed by other known methods.

Assuming, in FIGS. 1A and 1B, that the signals at the intermediate taps $122_1$, $122_2$, ..., $122_n$ to be $v_1(k)$, $v_2(k)$, ..., $v_n(k)$, then the input signals into the multiplier elements $110_1, 111_1, 112_2, \ldots, 110_n, 111_n$, with respect to the coefficient parameters $p_i$, $q_i$ are expressed by $v_1(k), v_1(k-1), v_2(k), v_2(k-1), \ldots, v_n(k), v_n(k-1)$. A correlation matrix R thereof is shown by the following equation (16) because of the orthogonality relationship among the signals $v_1(k), v_2(k), \ldots, v_n(k)$, and a ratio of the maximum eigen value $\lambda$max to the minimum eigen value $\lambda$min is small. Thus, a processing rate of the coefficient parameters $p_i$, $q_i$ of the present filter to reach the optimum value can be improved. Bernard Widrow et al discloses the correlation matrix in detail in the publication described above.

$$R = \begin{bmatrix} \{v_1(k)\}^2 & v_1(k)v_1(k-1) & 0 & 0 & 0 & 0 \\ v_1(k-1)v_1(k) & \{v_1(k-1)\}^2 & 0 & 0 & 0 & 0 \\ 0 & 0 & \{v_2(k)\}^2 & v_2(k)v_2(k-1) & 0 & 0 \\ 0 & 0 & v_2(k-1)v_2(k) & \{v_2(k-1)\}^2 & 0 & 0 \\ \vdots & \vdots & & & & \\ 0 & 0 & 0 & 0 & \cdots & \{v_2(k)\}^2 & v_2(k)v_2(k-1) \\ 0 & 0 & 0 & 0 & \cdots & v_n(k-1)v_n(k) & \{v_n(k-1)\}^2 \end{bmatrix} \quad (16)$$

Figure 2:
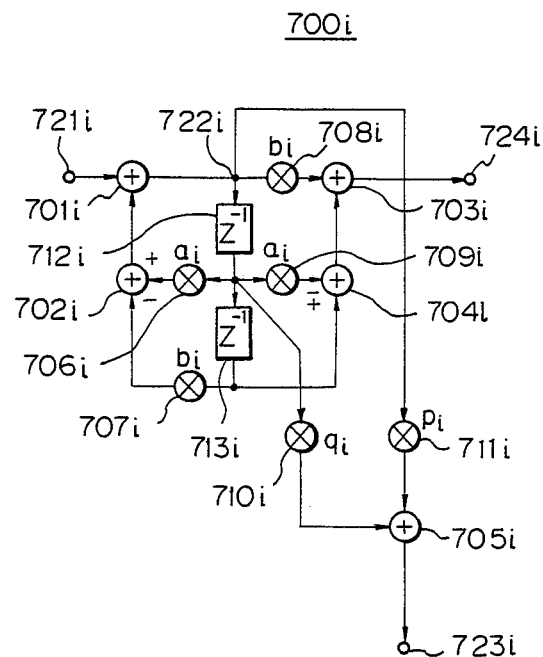
FIG. 2 is a block diagram illustrating another unit circuit capable of being employed as a unit circuit of FIG. 1.

Referring here to FIG. 2 illustrating another unit circuit usable as the unit circuits $100_1, 100_2, \ldots, 100_{n-1}$ of FIG. 1, a unit circuit $700_i$ comprises adder elements $701_i$ to $705_i$, multiplier elements $706_i$ to $711_i$, and two unit delay elements $712_i$, $713_i$. The unit circuit $700_i$ forms a secondary recursive filter between an input tap $721_i$ and an intermediate tap $722_i$, forms a primary recursive filter between the intermediate tap $722_i$ and a first output tap $723_i$, and forms a secondary nonrecursive filter between an intermediate tap $722_i$ and a second output tap $724_i$.

Figure 3:
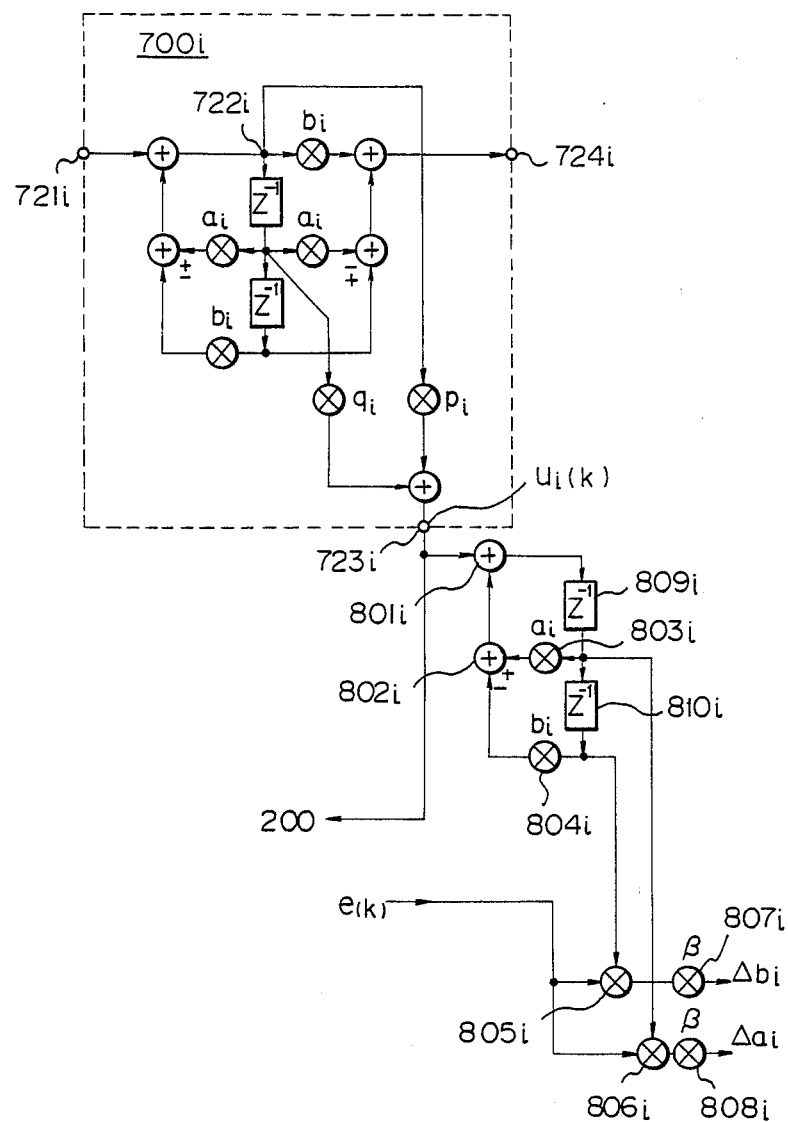
FIG. 3 is a block diagram showing another adaptive digital filter according to the present invention wherein a part of the adaptive digital filter for detecting modification values of the coefficient parameters $a_i$, $b_i$ is shown.

In addition, referring to FIG. 3 illustrating those parts related to the ith stage coefficient parameters $a_i$, $b_i$ of another filter according to the present invention, the filter includes adder elements $801_i$, $802_i$, multiplier elements $803_i$ to $808_i$, and unit delay elements $809_i$, $810_i$. These elements serve to detect modification amounts $\Delta a_i$, $\Delta b_i$ of the coefficient parameters shown by the following equations (19) and (20) for executing adjusting algorithms shown by the following equations (17) and (18).

$$a_i^{(\nu+1)} = a_i^{(\nu)} - \Delta a_i \quad (17)$$

$$b_i^{(\nu+1)} = b_i^{(\nu)} - \Delta b_i \quad (18)$$

$$\Delta a_i = \beta \frac{\partial u_i(k)}{\partial a_i} \cdot e(k) \quad (19)$$

$$\Delta b_i = \beta \frac{\partial u_i(k)}{\partial b_i} \cdot e(k) \quad (20)$$

Where, $u_i(k)$ shows a signal at the first output tap $723_i$. $\partial u_i/\partial a_i$ can be modified as shown by the following equation (21) assuming the inverse -transformation of the input signal $x_i$ to be $X(Z)$.

$$\frac{\partial u_i(k)}{\partial a_i} \cdot \frac{\partial}{\partial a_i} \frac{1}{2\pi j} \Phi x(Z)\phi_i(Z) Z^{k-1} dZ = \quad (21)$$

-continued $$\frac{1}{2\pi j} \Phi x(Z) \frac{(p_i + q_i Z^{-1}) \prod_{l=1}^{i=1} (b_l - a_l Z^{-1} Z^{-2})}{\prod_{l=1}^{i-1} (1 - a_l Z^{-1} + b_l Z^{-2})}.$$

$$\frac{\partial}{\partial a_i} \left( \frac{1}{1 - a_i Z^{-1} + b_i Z^{-2}} \right) Z^{k-1} dZ = \frac{1}{2\pi j} \text{ox}(Z) \cdot$$

$$\phi_i(Z) \frac{-Z^{-1}}{1 - a_i Z^{-1} + b_i Z^{-2}} \cdot Z^{k-1} dZ$$

$\partial u_i/\partial b_i$ can be elsewise modified as the following equation (22).

$$\frac{\partial u_i(k)}{\partial b_i} = \frac{\partial}{\partial a_i} \frac{1}{2\pi j} \Phi x(Z)\phi_i(Z) Z^{k-1} dZ = \quad (22)$$

$$\frac{1}{2\pi j} \Phi x(Z)\phi_i(Z) \frac{Z^{-2}}{1 - a_i Z^{-1} + b_i Z^{-2}} Z^{k-1} dZ$$

As shown in FIG. 3, adder elements $801_i$, $802_i$, multiplier elements $803_i$, $804_i$, and unit delay elements $808_i$, $810_i$ assure a transfer function $-z^{-1}/(1-a_i z^{-1}+b_i z^{-2})$ in the above equation 21 and a transfer function $z^{-2}/(1-a_i z^{-1}+b_i z^{-2})$ shown by the above equation (22).

The multiplier elements $805_i$ to $808_i$ take the product of the equations (17) and (18) from $\partial u_i(k)/\partial b_i$ as inputs and delivers modification amounts $\Delta a_i$, $\Delta b_i$.

Adaptive adjustment for the coefficient parameters of four groups a, b, p, g may be effected by iteratively updating the coefficient parameters of the groups p, g during a prescribed period of time while doing the same for coefficient parameters of the groups a, b and further alternatively repeating these two processes.

Although certain preferred embodiments have been shown and described, it should be understood that many changes and modifications may be made therein without departing from the scope of the appended claims.

What is claimed is:

1. An adaptive digital filter for identifying a transfer function of an unknown system comprising:
  (a) a network means including N paths, a first path thereamong having the following transfer function $\phi_1(Z)$ and 2 to N paths thereamong respectively having the following transfer function $\phi_i(Z)$ assuming $Z^{-1}$ to be a unit delay operator of the Z-transformation and said transfer functions $\phi_1(Z)$ and $\phi_i(Z)$ being expressed by the following equations:

$$\phi_1(Z) = \frac{p_1 + q_1 Z^{-1}}{1 - a_1 Z^{-1} + b_1 Z^{-2}}$$

$$\phi_i(Z) = (p_i + q_i Z^{-1}) \frac{\prod_{l=1}^{i-1}(b_l - a_l Z^{-1} + Z^{-2})}{\prod_{l=1}^{i}(1 - a_l Z^{-1} + b_l Z^{-2})}$$

wherein $i = 2, 3, \ldots, N$ and respective groups of p, q, a and b being coefficient parameters;

(b) an adder means for adding outputs available from said N paths, and (c) a control means for adaptively adjusting said coefficient parameters including at least the p and q groups in response to an error signal corresponding to a difference between said output from the adder means and an output from said unknown system whereby identifying the transfer function of said unknown system.

2. An adaptive filter according to claim 1, wherein said control means adaptively adjusts said coefficient parameters of the p and q groups in conformity with a steepest descent method.

3. An adaptive digital filter for identifying a transfer function of an unknown system comprising:

(a) a network means including N paths, a first path thereamong having the following transfer function $\phi_1(Z)$ and 2 to N paths thereamong respectively having the following transfer function $\phi_i(Z)$ assuming $Z^{-1}$ to be a unit delay operator of the Z-transformation and said transfer functions $\phi_1(Z)$ and $\phi_i(Z)$ being expressed by the following equations:

$$\phi_1(Z) = \frac{p_1 + q_1 Z^{-1}}{1 - a_1 Z^{-1} + b_1 Z^{-2}}$$

$$\phi_i(Z) = (p_i + q_i Z^{-1}) \frac{\prod_{l=1}^{i-1}(b_l - a_l Z^{-1} + Z^{-2})}{\prod_{l=1}^{i}(1 - a_l Z^{-1} + b_l Z^{-2})}$$

wherein $i = 2, 3, \ldots, N$ and respective groups of p, q, a and b being coefficient parameters;

(b) an adder means for adding outputs available from said N paths, and (c) a control means for adaptively adjusting said coefficient parameters including at least the p and q groups in response to an error signal corresponding to a difference between said output from the adder means and an output from said unknown system whereby identifying the transfer function of said unknown system;

wherein said control means adaptively adjusts said p and q groups during a prescribed period of time, and then doing the same for the a and b groups, and furthermore alternatively repeating said both adjustments for each prescribed period of time.

4. An adaptive digital filter for identifying a transfer function of an unknown system comprising:

(a) a network means including N paths, a first path thereamong having the following transfer function $\phi_1(Z)$ and 2 to N paths thereamong respectively having the following transfer function $\phi_i(Z)$ assuming $Z^{-1}$ to be a unit delay operator of the Z-transformation and said transfer functions $\phi_1(Z)$ and $\phi_i(Z)$ being expressed by the following equations:

$$\phi_1(Z) = \frac{p_1 + q_1 Z^{-1}}{1 - a_1 Z^{-1} + b_1 Z^{-2}}$$

$$\phi_i(Z) = (p_i + q_i Z^{-1}) \frac{\prod_{l=1}^{i-1}(b_l - a_l Z^{-1} + Z^{-2})}{\prod_{l=1}^{i}(1 - a_l Z^{-1} + b_l Z^{-2})}$$

wherein $i = 2, 3, \ldots, N$ and respective groups of p, q, a and b being coefficient parameters;

(b) an adder means for adding outputs available from said N paths, and (c) a control means for adaptively adjusting said coefficient parameters including at least the p and q groups in response to an error signal corresponding to a difference between said output from the adder means and an output from said unknown system whereby identifying the transfer function of said unknown system;

wherein said network means comprises N unit circuit means, each of said unit circuits from first to (N−1)th stages forming a secondary recursive filter having one coefficient parameter of the a group and one coefficient parameter of the b group between an input tap and an intermediate tap, said each of said unit circuits forming a primary non-recursive filter having one coefficient parameter of the p group and one coefficient parameter of the q group between said intermediate tap and a first output tap, and said each of said unit circuits forming a secondary nonrecursive filter having one coefficient parameter of the a group and one coefficient parameter of the b group between said intermediate tap and a second output tap, the final stage unit circuit forming a secondary recursive filter having $a_n$ and $b_n$ as the coefficient parameters between the input tap and intermediate tap, and forming a primary nonrecursive filter having $p_n$ and $q_n$ as the coefficient parameters between said intermediate tap and first output tap, and each input tap of said each unit circuit being connected with a second output tap of the preceeding stage unit circuit for forming N paths having said transfer functions $\phi_1(Z)$ and $\phi_i(Z)$ among the input terminal and said first output taps of said N unit circuits.

5. An adaptive filter according to claim 4, wherein said control means has unit circuits corresponding to the first output taps of said unit circuit of said network means, each of said unit circuits of said control means having two output taps and further including, between said unit circuit and said first output tap of said network means, a circuit having the following transfer functions $w_a$, $w_b$, multiplier means for taking the product of each output from said circuit described just above and an error signal, and another multiplier means for multiplying the coefficient parameters of the a and b groups by a constant for preparing the amount of the adjustment for said coefficient parameters, said transfer functions being expressed by the following equation:

$$W_a = \frac{Z^{-1}}{1 - a_i Z^{-1} + b_i Z^{-2}}$$

$$W_b = \frac{Z^{-2}}{1 - a_i Z^{-1} + b_i Z^{-2}}.$$

* * * * *